United States Patent [19]

Ogura

[11] Patent Number: 4,646,121
[45] Date of Patent: Feb. 24, 1987

[54] THYRISTOR WITH A SELF-PROTECTION FUNCTION FOR BREAKOVER TURN-ON FAILURE

[75] Inventor: Tsuneo Ogura, Kamakura, Japan

[73] Assignee: Tokyo Shibaura Denki Kabushiki Kaisha, Kawasaki, Japan

[21] Appl. No.: 494,367

[22] Filed: May 13, 1983

[30] Foreign Application Priority Data

Jun. 30, 1982 [JP] Japan .............................. 57-112943

[51] Int. Cl.⁴ .................... H01L 29/74; H01L 29/167
[52] U.S. Cl. .......................................... 357/38; 357/64
[58] Field of Search ................................. 357/38, 64

[56] References Cited

U.S. PATENT DOCUMENTS

| | | | |
|---|---|---|---|
| 3,349,299 | 10/1967 | Herlet ................................. | 357/38 |
| 4,079,403 | 3/1978 | Temple ............................... | 357/38 |
| 4,165,517 | 8/1979 | Temple et al. ..................... | 357/38 |
| 4,214,254 | 7/1980 | Kimura et al. ..................... | 357/38 |
| 4,240,091 | 12/1980 | Yatsuo et al. ..................... | 357/38 |

FOREIGN PATENT DOCUMENTS

| | | | |
|---|---|---|---|
| 2712114 | 10/1977 | Fed. Rep. of Germany ........ | 357/38 |
| 3151212 | 8/1982 | Fed. Rep. of Germany ........ | 357/38 |
| 5641180 | 11/1977 | Japan ................................. | 357/38 |
| 54-37589 | 3/1979 | Japan ................................. | 357/38 |

OTHER PUBLICATIONS

Temple et al, "High-Power Dual Amplifying Gate Light Triggered Thyristors", IEEE Trans. on Electron Devices, vol. ED-23, No. 8, Aug. 1976, pp. 893–898.
International Electron Devices Meeting Technical Digest, p. 410; J. X. Przybsz et al; 1981.

Primary Examiner—William D. Larkins
Assistant Examiner—John Lamont
Attorney, Agent, or Firm—Oblon, Fisher, Spivak, McClelland & Maier

[57] ABSTRACT

A thyristor is comprised of a main thyristor region, a gate region for causing the main thyristor region to be turned on in response to a gate signal, and an amplifying gate region which is turned on to permit the main thyristor region to be turned on when an overvoltage is supplied to the thyristor in the absence of gate signal at the gate portion. The amplifying gate region is provided in a region except an intermediate region between the gate portion and the end of the main thyristor region facing the gate portion. A minority carrier lifetime in the amplifying gate region is longer than that of the main thyristor region and the gate portion.

19 Claims, 11 Drawing Figures

THYRISTOR WITH A SELF-PROTECTION FUNCTION FOR BREAKOVER TURN-ON FAILURE

BACKGROUND OF THE INVENTION

1. Field of the Invention

The present invention relates to a thyristor with a self-protection function for breakover turn-on failure.

2. Discussion of Background

The thyristor has four regions with different conductivity types alternately arranged, i.e. P, N, P and N regions. A gate electrode, for example, is provided in an intermediate region of one of the four regions. In the semiconductor device of this type, a current flows through a path between the anode and cathode electrodes of a main thyristor by a signal applied to the gate electrode. An amplifying gate is provided near the gate electrode so as to facilitate the turn-on of the main thyristor by the gate signal in a normal state. When the amplifying gate is turned on, the main thyristor is turned on by its load current. Thus, the auxiliary gate prevents the main thyristor from being destroyed when the gate electrode is being supplied with the gate signal. When no gate signal is supplied, if an overvoltage in excess of a breakover voltage of the thyristor is applied to the thyristor, the main thyristor is often turned on prior to the turn-on of the auxiliary thyristor. In such a case, the firing region of the thyristor, unlike the amplifying gate portion, is generally in the shape of a spot, and hence has a small region which cannot expand quickly. For this reason, the thyristor cannot withstand a rush current, which results in the destruction of the thyristor.

For solving the above disadvantage, a semiconductor device with an additional amplifying gate, as disclosed in Japanese Patent Publication (KOKOKU) No. 56-41180 has been proposed. In this device, the additional or second amplifying gate is triggered by a leak current frequently generated around the peripheral part of the semiconductor substrate. An amount of the leak current is susceptible to a surface condition of the peripheral part of the substrate. Therefore, the turning on of the second amplifying gate is unstable.

U.S. Pat. No. 4,165,517 discloses another semiconductor device for the thyristor, in which the minority carrier lifetime in the substrate under the gate electrode is selected to be larger than that in the other part of the thyristor in order to prevent a turn-on failure of the semiconductor device. However, since a large current always flows through the region near the substrate region under the gate electrode when the thyristor is turned-on, this region generates more heat than other portions. With a rise in temperature, the breakover voltage tends to rise. Therefore, the protection for the destruction of the thyristor is not sufficient.

SUMMARY OF THE INVENTION

The object of the present invention is to provide a thyristor with a self-protection function for protecting the thyristor per se from being destroyed when an overvoltage is applied across the anode-cathode path in the absence of a gate signal at the gate thereof.

In the present invention, a thyristor is provided with a main thyristor region, a gate portion for causing the main thyristor region to be turned on in response to a gate signal, and an amplifying gate region which serves as an auxiliary thyristor and is first turned on to permit the main thyristor region to be turned on when an overvoltage is applied to the thyristor in the absence of a gate signal at the gate portion. The amplifying gate region is provided in a region except for an intermediate region between the gate portion and the end portion of the main thyristor region facing the gate portion. The lifetime of the minority carriers in the amplifying gate region is longer than that of the minority carriers in the main thyristor region and the gate portion.

With such an arrangement, the reliability of the thyristor is remarkably improved.

BRIEF DESCRIPTION OF THE DRAWINGS

Other objects and features of the present invention will be apparent from the following description taken in conjunction with the accompanying drawings, in which.

DETAILED DESCRIPTION OF THE PREFERRED EMBODIMENTS

Figure 1:
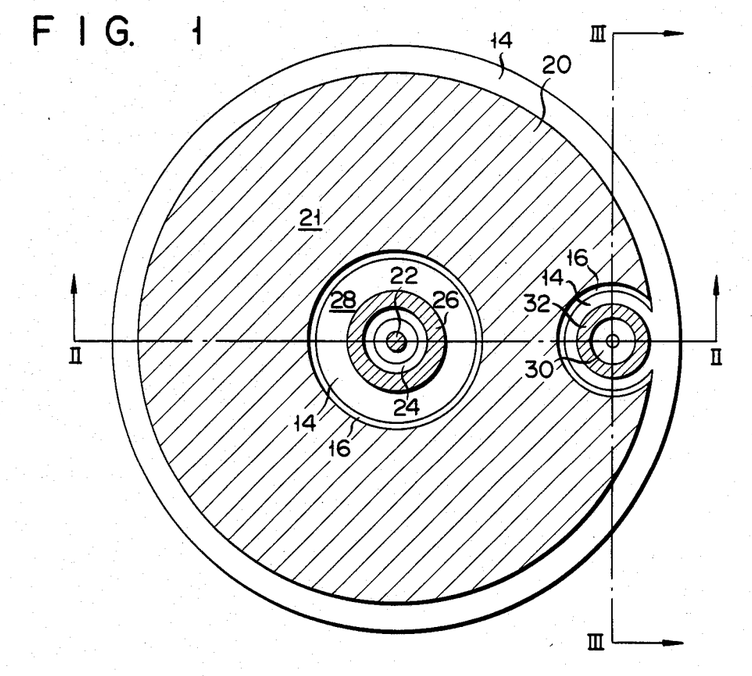
FIG. 1 shows a plan view of a first embodiment of a thyristor according to the present invention.
Figure 2:
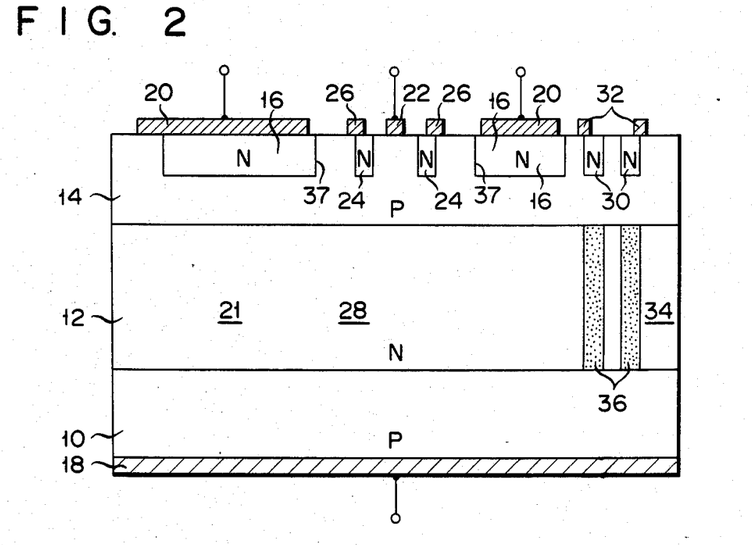
FIG. 2 shows a cross sectional view taken on line II—II in FIG. 1.
Figure 3:
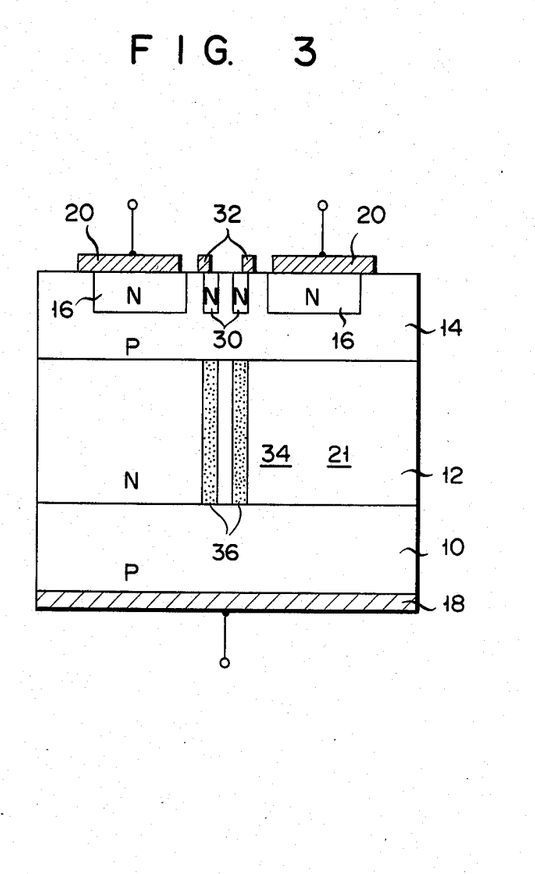
FIG. 3 shows a cross sectional view taken on line III—III in FIG. 1.

An embodiment of the present invention will be described referring to FIGS. 1 to 3. An N type base layer 12 is formed on a P type emitter layer 10. A P type base layer 14 is formed on the N type base layer 12 and an N type emitter layer 16 is formed on a portion of the P type base layer 14. A circular anode electrode 18 is formed on the surface of the P type emitter layer 10, and a doughnut-shaped cathode electrode 20 is formed on the surface of the N type emitter layer 16. The cathode electrode 20 is also connected to the P type base layer 14. The P type emitter layer 10, the N type base layer 12, the P type base layer 14 and the N type emitter layer 16, which are sandwiched by the anode electrode 18 and the cathode electrode 20, cooperate to form a main thyristor 21. A gate electrode 22 is provided within the doughnut-shaped cathode electrode 20. An auxiliary emitter layer 24 is provided in the P type base layer 14, enclosing the gate electrode 22. An auxiliary electrode 26 is formed so as to connect the auxiliary emitter layer 24 with the P type base layer 14. The P type emitter layer 10, the N type base layer 12, the P type base layer 14 and the auxiliary emitter layer 24, which are sandwiched between the anode electrode 18 and the auxiliary electrode 26, cooperate to form a first amplifying gate region (auxiliary thyristor) 28. The first amplifying gate region 28 is turned on prior to the operation of the main thyristor region 21, by a gate signal supplied to the gate electrode 22. The main thyristor 21 is turned on by a load current flowing through the first amplifying gate region 28.

A second amplifying gate region (auxiliary thyristor) 34 having an auxiliary emitter layer 30 and an auxiliary electrode 32 is provided in a portion of the peripheral of the N type emitter layer 16, in addition to the first amplifying gate region 28. The lifetime of minority carriers in at least a portion 36 of the N type base layer 12 forming the second amplifying gate region 34 is longer than that in the semiconductor layers of other portions, for example, the main thyristor region 21, first amplifying gate region 28 or the other semiconductor region of the second amplifying gate region 34. The portion 36 lies under the auxiliary emitter layer 30. As will be described later, in regards to fabrication to increase the lifetime of the minority carriers in the portion 36, it is necessary to increase the lifetime of the minority carriers in the entire region of the second amplifying gate region 34. In this respect, the minority carrier lifetime of the semiconductor layer forming the second amplifying gate region 34 may be longer than the minority carrier lifetime of the other semiconductor layers.

A principle of the operation of the second amplifying gate region in the present embodiment will now be described. When an overvoltage is supplied to the thyristor, the thyristor is generally turned on due to the breakover. The breakover voltage has a positive temperature characteristic, as described in "Temperature Dependence of Avalanche Multiplication on Semiconductors" by Crowell & Sze, Appl. Phys. Lett. 9,242,1966 for example. Because a main current flows in the main thyristor region no current in an ordinary operation flows through the second amplying gate region 34. Therefore, the temperature rise in this portion is lower than that of the other semiconductor layers, so that the breakover voltage of the second amplifying gate region is lower than that of the other portion. Further, the minority carrier lifetime in this portion is selected to be larger than that in the remaining portions. Accordingly, the breakover voltage of the second amplifying gate region 34 is low. As a result, if an overvoltage is applied between the anode electrode 18 and the cathode electrode 20 when no gate signal is applied to the gate electrode 22, the second amplifying gate region 34 is first fired. Although the second amplifying gate region 34 is provided in the main thyristor region 21, it is uniformly turned on because it has an amplifying gate structure. Then, it uniformly fires the main thyristor region 21. Thus, the thyristor is protected from being destroyed.

In order to increase the minority carrier lifetime of the second amplifying gate region 34, it is satisfactory to selectively introduce a lifetime killer, for example, heavy metal into only the other portions to reduce the switching time. Alternatively, radiation may be selectively directed onto the other portions to form a lattice defect therein. Further, more radiation may be directed onto the region outside the second amplifying gate region 34 than onto the second amplifying gate region 34. In an additional alternative method, heavy metal is selectively diffused into the region other than the second amplifying gate region 34. Then, this region is entirely irradiated. Through this process, the minority carrier lifetime in the region other than the second amplifying gate region 34 is shorter than that of the second amplifying gate region 34. It is evident that many other methods are available for shortening the moniroty carrier lifetime of the region other than the second amplifying gate region 34.

The breakover voltage $V_{BO}$ of the thyristor in both the forward and backward directions is generally expressed by the following equation $$V_{BO} = V_B (1 - \alpha_{pnp})^{1/m}$$

where $V_B$ is the avalanche breakdown voltage at the PN junction determined by a donor density in the N type base layer, $\alpha_{pnp}$ a current amplification factor of the PNP region (transistor region), and m a constant related to a multiplication factor. From this equation, it is seen that when the lifetime of the N type base layer 12 increases, the $\alpha_{pnp}$ increases and hence the $V_{BO}$ becomes small. An experiment conducted by us showed that in a thyristor in which the breakover voltage of the main thyristor region 21 is 2,000 V for the lifetime therein of 5 μs, the breakover voltage was 1,700 V when the lifetime in the second amplifying gate region 34 was 20 μs. As described above, by setting the lifetime of the second amplifying gate region 34 larger than the other portions, the breakover voltage is made lower than that of the other portions. When the thyristor is impressed with the overvoltage, the second amplifying gate region 34 is first turned on.

Figure 4:
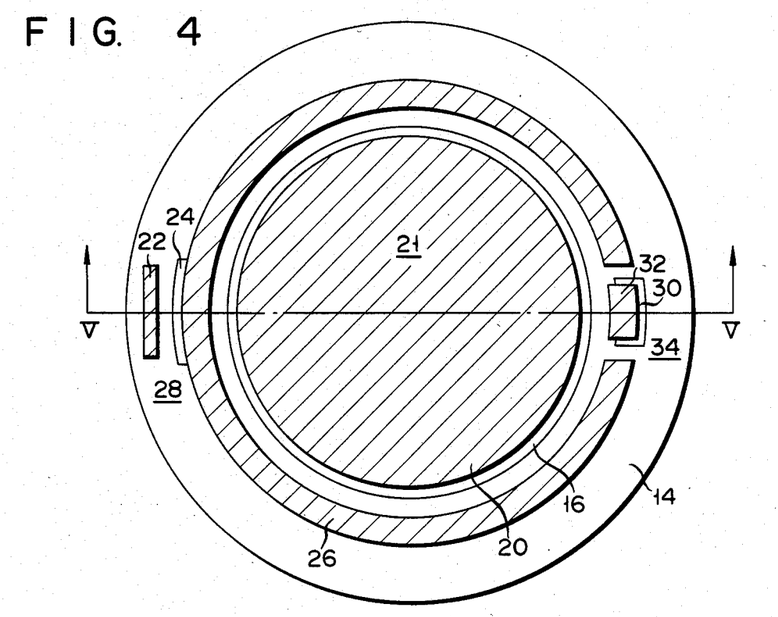
FIG. 4 is a plan view of a second embodiment of a thyristor according to the present invention.
Figure 5:
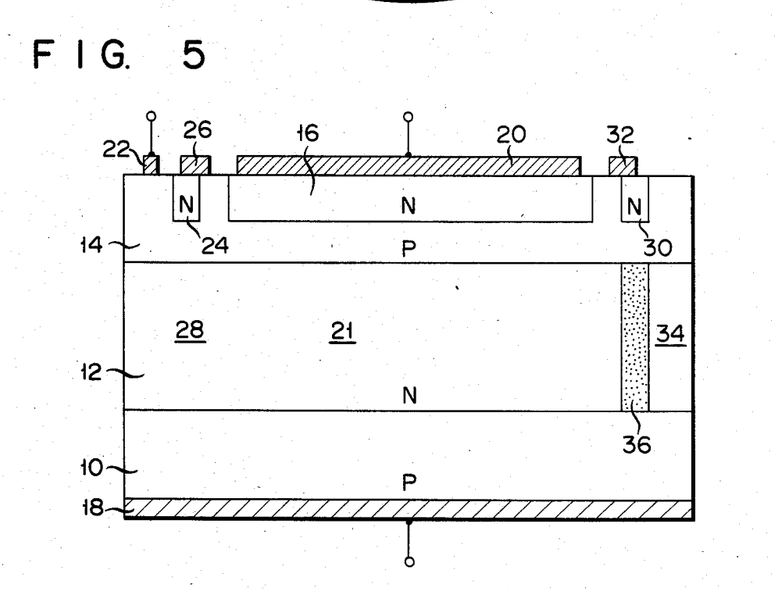
FIG. 5 shows a cross sectional view taken on line V—V in FIG. 4.

A second embodiment of a thyristor according to the present invention will be described referring to FIGS. 4 and 5. In the first embodiment, the gate electrode 22 is located at the center of the thyristor. When the diameter of the thyristor is large, the gate electrode 22 is normally provided on the peripheral portion of the thyristor, and the first and second amplifying gate 28 and 34 are provided outside the main thyristor region 21. In FIG. 4, the gate electrode 22 and the second amplifying gate region 34 are oppositely disposed with respect to the main thyristor region 21. The auxiliary electrode 26 of the first amplifying gate region 28 is disposed enclosing the main thyristor 21. The minority carrier lifetime of at least the N type base layer 36 under the auxiliary emitter layer 30 of the second amplifying gate region 34 is longer than that of the other semiconductor layers. Accordingly, if an overvoltage is applied between the anode and cathode electrodes of the thyristor when no gate signal is applied to the thyristor, the second amplifying gate region 34 is turned on and then the main thyristor region 21 is turned on. This results in protection of the thyristor. The configuration of the remaining portions is the same as those of the first embodiment.

Figure 6:
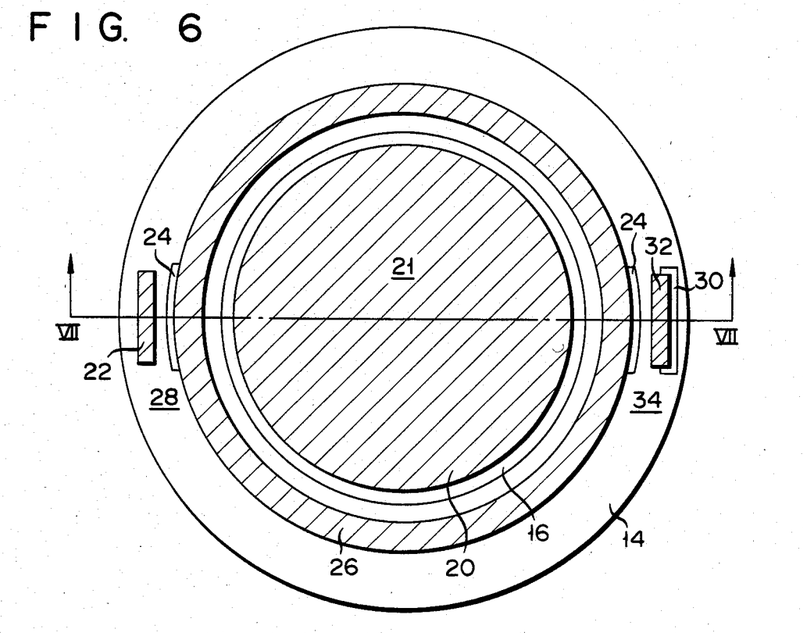
FIG. 6 is a plan view of a third embodiment of the present invention.
Figure 7:
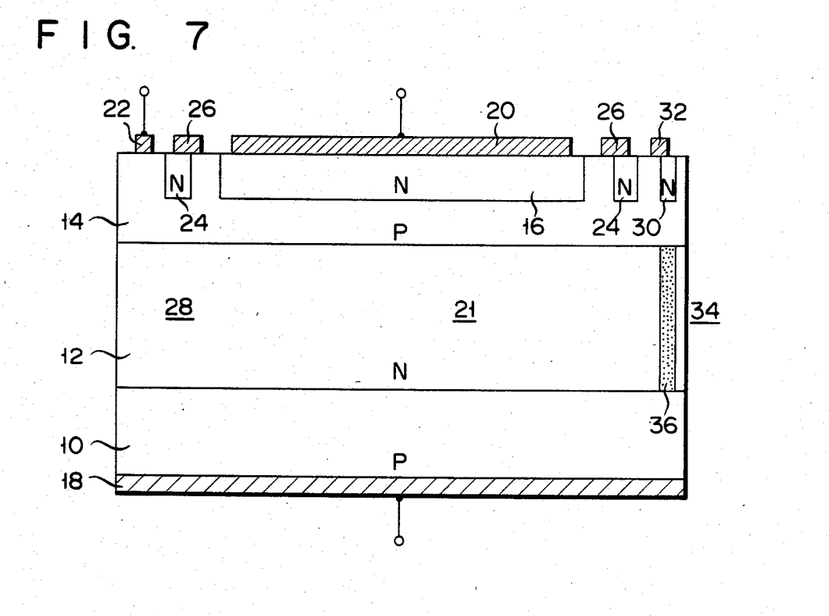
FIG. 7 shows a cross sectional view taken on line VII—VII in FIG. 6.

Turning now to FIGS. 6 and 7, there is shown a third embodiment of a thyristor according to the present invention. In the present embodiment, the auxiliary electrode 26 of the first amplifying gate region 28 is formed completely enclosing the main thyristor region 21. The second amplifying gate region 34 is provided outside the auxiliary electrode 26. The auxiliary electrode 26 functions to enlarge the turn-on portion of the main thyristor 21 caused when the gate electrode 22 is supplied with a gate signal. The electrode 26 functions also to expand the turn-on portion of the main thyristor 21 by the second amplifying gate region 34. This portion has a two-stage amplifying gate structure. The remaining configuration is the same as that of the second embodiment.

The location of the second amplifying gate region 34 is not limited to that of the above-mentioned embodiment. It is satisfactory that the second amplifying gate region 34 is located in a region except an intermediate region between the end 37 of the main thyristor region and the gate electrode 22 (see FIG. 2). In other words, the necessity is that the second amplifying gate region 34 is provided in the interior of the main thyristor 21 or part of its periphery.

Figure 8:
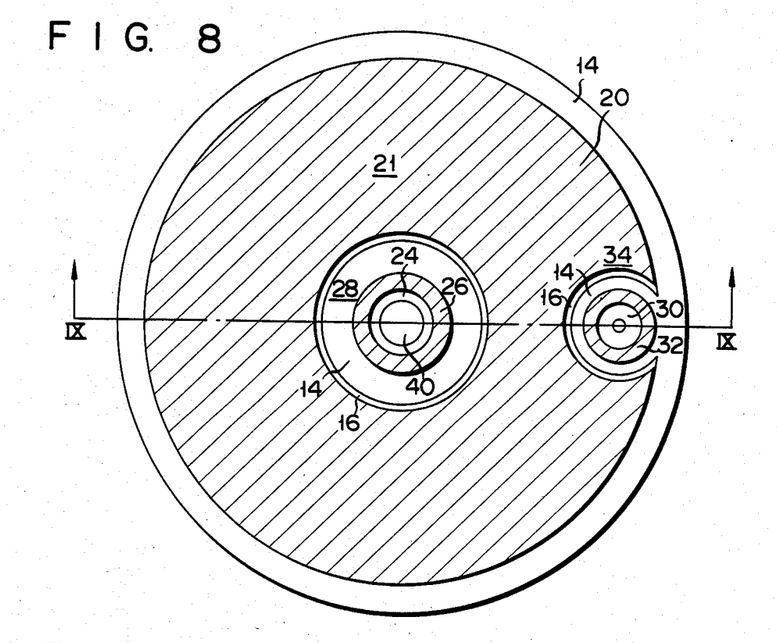
FIG. 8 shows a plan view of a light activated thyristor which is a fourth embodiment of the present invention.
Figure 9:
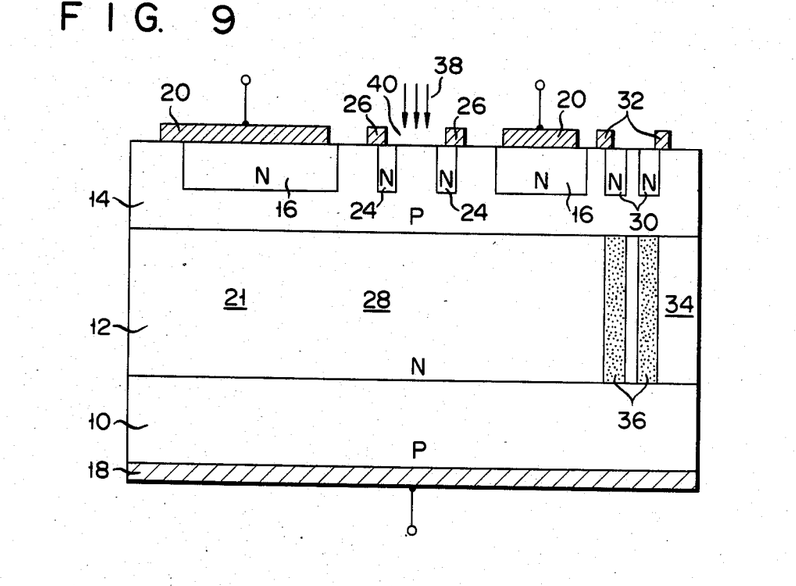
FIG. 9 shows a cross sectional view taken on line IX—IX of FIG. 8.

FIGS. 8 and 9 show a light activated thyristor which is turned on in response to trigger light 38 incident on the light receiving section 40, and is a fourth embodiment of the present invention. The difference of this embodiment from the FIG. 1 embodiment is only the gate structure.

Figure 10:
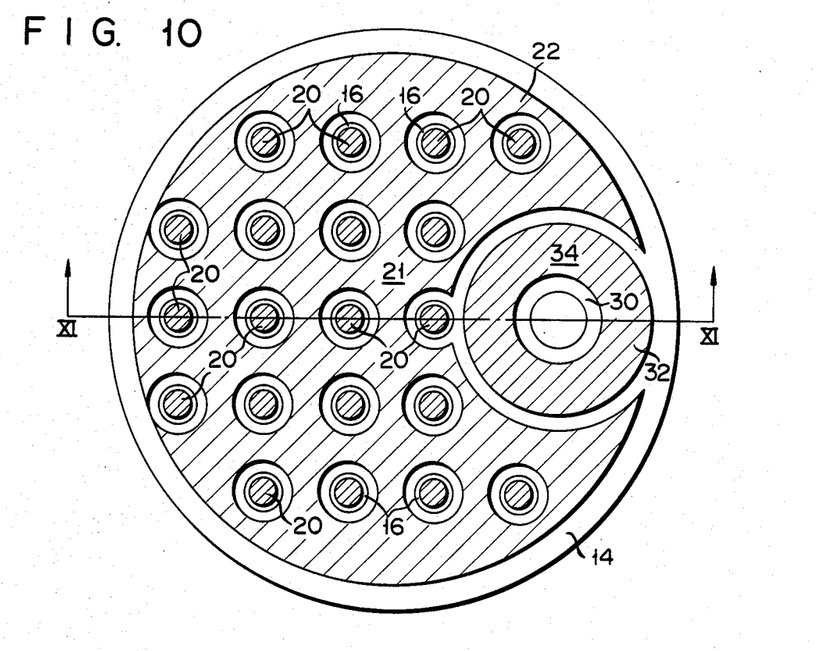
FIG. 10 shows a plan view of a gate turn-off thyristor according to the present invention.
Figure 11:
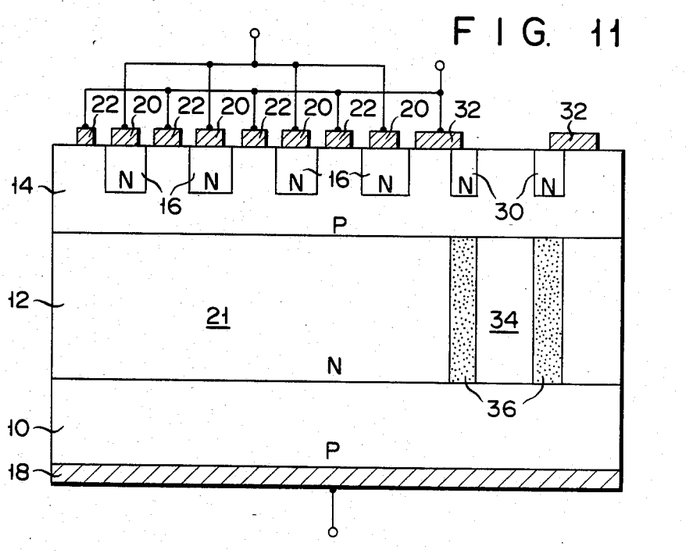
FIG. 11 shows a cross sectional view taken on line XI—XI of FIG. 10.

FIGS. 10 and 11 shows a fifth embodiment of the present invention in which the present invention is applied to a gate turn-off thyristor. In this case, a plurality of N type emitter layers 16 are formed in the surface of the P type base layer 14 in a dotted manner. A gate electrode 22 is disposed enclosing a plurality of N type emitter layers 16. In the gate turn-off thyristor, an amplifying gate region, as in the case of the first to third embodiments, is not frequently formed between the gate electrode 22 and the main thyristor 21. Accordingly, one amplifying gate region 34 is formed.

What is claimed is:

1. A thyristor with a self-protection function for a breakover turn-on failure comprising:
   a main thyristor region;
   gate means for causing said main thyristor region to be turned on in response to an annular shaped gate signal; and
   a first amplifying gate region serving as an auxiliary thyristor and provided in a region except an intermediate region between said gate means and the end of said main thyristor region facing said gate means, a minority carrier lifetime of said first amplifying gate region being longer than that of a region under said main thyristor region and said gate means so that when an overvoltage is applied to said thyristor in the absence of a gate signal at the gate portion, said first amplifying gate region is first turned on to permit said main thyristor region to be turned on.

2. A thyristor according to claim 1, wherein heavy metal is selectively diffused into a region other than said first amplifying gate region, so that a minority carrier lifetime of said region is shorter than that of said first amplifying gate region.

3. A thyristor according to claim 1, wherein radiation is selectively directed onto a region outside first amplifying gate region, so that a minority carrier lifetime of said region outside said first amplifying gate region is shorter than that of said first amplifying gate region.

4. A thyristor according to claim 1, wherein more radiation is directed onto a region outside said first amplifying gate region than onto said first amplifying gate region, so that a minority carrier lifetime of said region outside said first amplifying gate region is shorter than that of said first amplifying gate region.

5. A thyristor according to claim 1, wherein heavy metal is selectively diffused into a region other than said first amplifying gate region and radiation is directed onto the entire surface, so that a minority carrier lifetime of said region other than said first amplifying gate region is shorter than that of said first amplifying gate region.

6. A thyristor according to claim 1, wherein heavy metal is selectively diffused into a region other than said first amplifying gate region and radiation is selectively directed onto said region, so that a minority carrier lifetime of said region other than said first amplifying gate region is shorter than that of said first amplifying gate region.

7. A thyristor according to claim 1, further comprising a second amplifying gate region adjacent to said gate means and being turned on in response to a gate signal applied to said gate means to permit said main thyristor region to be turned on.

8. A thyristor according to claim 1, wherein said gate means is a gate electrode for receiving an electrical gate signal.

9. A thyristor according to claim 1, wherein said gate means is a photo sensitive portion for receiving an optical gate signal.

10. A thyristor with a self-protection function for a breakover turn-on failure comprising:
   a P type emitter layer;
   an N type base layer forming a junction together with said P type emitter layer;
   a P type base layer forming a junction together with said N type base layer;
   an N type emitter layer provided on the surface of said P type base layer;
   an anode electrode provided on said P type emitter layer;
   a cathode electrode connected to said N type emitter layer;
   said P type emitter layer, said N type base layer, said P type base layer and said N type emitter layer, which are sandwiched between said anode and cathode electrodes, cooperatively forming a main thyristor region;
   gate means provided on the surface of said P type base layer for causing said main thyristor region to be turned on;
   an N type auxiliary emitter layer provided at a predetermined portion on said P type base layer surface except the P type base layer between said gate means and the end of said N type emitter layer facing said gate means;
   an auxiliary electrode connected to said N type auxiliary emitter layer and said P type base layer;
   a lifetime of minority carriers in an annular portion of the N type base layer under said N type auxiliary emitter layer being longer than that of minority carriers in other portion of N type base layers; and
   said P type emitter layer, said N type base layer with longer minority carrier lifetime, said P type base layer, and said N type auxiliary emitter layer, which are sandwiched between said anode electrode and said auxiliary electrode, cooperatively forming a first amplifying gate region which serves as an auxiliary thyristor, whereby when an overvoltage is applied between said anode and cathode electrodes in the absence of a gate signal at said gate means, said first amplifying gate region including said auxiliary emitter layer and said auxiliary electrode is first turned on to permit said main thyristor region to be turned on.

11. A thyristor according to claim 10, wherein heavy metal is selectively diffused into a region other than said first amplifying gate region, so that a minority carrier lifetime of said region is shorter than that of said first amplifying gate region.

12. A thyristor according to claim 10, wherein radiation is selectively directed onto a region outside said first amplifying gate region, so that a minority carrier lifetime of said region outside said first amplifying gate region is shorter than that of said first amplifying gate region.

13. A thyristor according to claim 10, wherein more radiation is directed onto a region outside said first amplifying gate region than onto said first amplifying gate region, so that a minority carrier lifetime of said region outside said first amplifying gate region is shorter than that of said first amplifying gate region.

14. A thyristor according to claim 10, wherein heavy metal is selectively diffused into a region other than said first amplifying gate region and radiation is directed onto the entire surface so that a minority carrier lifetime of said region other than said first amplifying gate region is shorter than that of said first amplifying gate region.

15. A thyristor according to claim 10, wherein heavy metal is selectively diffused into a region other than said first amplifying gate region and radiation is selectively directed onto said region, so that a minority carrier lifetime of said region other than said first amplifying gate region is shorter than that of said first amplifying gate region.

16. A thyristor according to claim 10, further comprising a second amplifying gate region adjacent to said gate means and being turned on in response to a gate signal applied to said gate means to permit said main thyristor region to be turned on.

17. A thyristor according to claim 10, wherein said gate means is a gate electrode for receiving an electrical gate signal.

18. A thyristor according to claim 10, wherein said gate means is a photo sensitive portion for receiving an optical gate signal.

19. A thyristor according to claim 17, wherein said N type emitter layer is divided into a plurality of segments, and said gate electrode is disposed enclosing said divided N type emitter layer segments to have a gate turn-off function.

* * * * *